(12) United States Patent
Thibedeau et al.

(10) Patent No.: US 7,764,071 B2
(45) Date of Patent: Jul. 27, 2010

(54) TESTING AND DISPLAY OF ELECTRICAL SYSTEM IMPEDANCE

(75) Inventors: Dennis G. Thibedeau, Franklin, WI (US); Gary Jonker, Kenosha, WI (US); Alejandro P. Brott, Chicago, IL (US); Paul A. Willems, Kenosha, WI (US); Alan D. Goetzelmann, Wheeling, IL (US)

(73) Assignee: Snap-On Incorporated, Pleasant Prairie, WI (US)

( * ) Notice: Subject to any disclaimer, the term of this patent is extended or adjusted under 35 U.S.C. 154(b) by 1151 days.

(21) Appl. No.: 11/234,153

(22) Filed: Sep. 26, 2005

(65) Prior Publication Data

US 2006/0017450 A1    Jan. 26, 2006

Related U.S. Application Data

(62) Division of application No. 10/619,187, filed on Jul. 15, 2003, now Pat. No. 7,215,130.

(51) Int. Cl.
G01R 27/08    (2006.01)
G01N 27/416    (2006.01)

(52) U.S. Cl. .................. 324/705; 324/691; 324/715; 324/430

(58) Field of Classification Search ............ 324/430, 324/691, 715
See application file for complete search history.

(56) References Cited

U.S. PATENT DOCUMENTS

| | | | |
|---|---|---|---|
| 5,721,688 A * | 2/1998 | Bramwell | 324/430 |
| 6,097,193 A | 8/2000 | Bramwell | |
| 6,172,505 B1 | 1/2001 | Bertness | |
| 6,313,608 B1 | 11/2001 | Varghese et al. | |
| 6,384,614 B1 | 5/2002 | Hager et al. | |
| 6,411,098 B1 | 6/2002 | Laletin | |
| 6,556,019 B2 | 4/2003 | Bertness | |
| 6,566,883 B1 | 5/2003 | Vonderhaar et al. | |
| 6,667,624 B1 * | 12/2003 | Raichle et al. | 324/421 |
| 7,089,127 B2 | 8/2006 | Thibedeau et al. | |
| 7,215,130 B2 | 5/2007 | Thibedeau et al. | |
| 2002/0036504 A1 | 3/2002 | Troy et al. | |
| 2003/0038637 A1* | 2/2003 | Bertness et al. | 324/426 |

* cited by examiner

Primary Examiner—Timothy J Dole
(74) Attorney, Agent, or Firm—McDermott Will & Emery LLP

(57) ABSTRACT

An automated method is provided for testing an electrical circuit using a system tester. Load leads and sense leads of the tester are connectable to any two points of an electrical circuit, such as in a vehicle system, for displaying in real time the impedance between the tested circuit points. A controller is responsive to various sensed signals to calculate impedance, admittance or conductance, and related parameters, such as available cranking current, and provide results for read out or display. A load may be connected across the circuit points under test, the sensed signals derived from a current sense amplifier, a DC voltage amplifier, a ripple amplifier, and an AC amplifier.

16 Claims, 8 Drawing Sheets

TESTING AND DISPLAY OF ELECTRICAL SYSTEM IMPEDANCE

RELATED APPLICATIONS

This application is a divisional of U.S. application Ser. No. 10/619,187 filed Jul. 15, 2003, now U.S. Pat. No. 7,215,130 which contains subject matter related to copending U.S. application Ser. No. 10/460,652, filed Jun. 13, 2003.

TECHNICAL FIELD

The present disclosure relates to electrical system testing, more particularly to determining and displaying impedance values at various vehicle system circuit points.

BACKGROUND

Devices of various types are commercially available for testing and evaluating batteries, starters, alternators in vehicle systems, as well as for testing battery chargers. Often, however, a technician will independently test the battery, alternator and starter only to find that each of these components tests good even though the vehicle owner is experiencing difficulties in operation of the vehicle. Such difficulty may be caused, for example, by high impedance in the system that limits available cranking current when the system is under load. High impedance may be the result of contributing factors, such as poor connections at various circuit locations, circuit elements that are not individually accessible for connection to the tester, or a combination of individual faults. A cable itself may have inherent impedance that is detrimental to the system. Use of conventional DC ohmmeters with conventional testing methods are unable to obtain readings having fine enough resolution to detect such cable impedance.

A need exists for a tester that can provide a continuous reading or display of impedance at various circuit points of the system so that the technician can readily and immediately observe the change in impedance as the tested circuit points are changed. Such provision would also be of significant benefit for real time display of the effects on impedance by changes in loading conditions of the system. A need also exists for a testing method capable of high resolution impedance detection.

A shortcoming of conventional testers is the difficulty in connecting test leads to remote circuit points in a vehicle. In a large truck, for example, system circuit elements near the front of the vehicle may be readily accessible while connection of the test leads to other test points is inconvenient or impossible with conventional test leads. A further need thus exists for an ability to readily gain access to any test point in the electrical system.

Technical Disclosure

The present disclosure fulfills these and other needs in part by providing a system tester in which load leads and sense leads are connectable to any two points of an electrical circuit, such as in a vehicle system, and display means for displaying in real time the impedance between the separate points of the circuit. A controller is responsive to various sensed signals to calculate impedance and related parameters, such as available cranking current for a vehicle, and provide results for read out or display. The term "impedance," is used throughout this disclosure in a generic sense to encompass conductance and admittance characteristics, which are directly related to impedance. It is to be understood that the results obtained by the system tester, although described as impedance values, may be expressed in terms of conductance or admittance as well as, or in lieu of, impedance.

A load may be connected across the circuit points under test with an alternating current source applied thereto. A current sense amplifier connected to the load leads, a DC voltage amplifier, a ripple amplifier, and an AC amplifier connected to the sense leads, each provide sensed signals to a respective input channel of an analog to digital converter. The analog to digital converter output is applied to the controller. The controller selects appropriate channel outputs from the analog to digital converter as required for the particular calculation performed.

A beneficial aspect of the system tester is that impedance values can be calculated for a plurality of circuit points at which the load leads and sense leads may be connected. The calculated impedance values can be compared with respective threshold values that may be pre-established or input by a user. Results can then be displayed in the form of impedance readouts as well as analysis thereof. For example, a simple "pass-fail" indication can be displayed for each test or a more detailed report, such as the variance between tested impedance and threshold for each test, can be displayed. Based on test impedance values and information relating to the vehicle system stored in the tester, the available cranking current can be calculated and displayed.

A further aspect of the disclosure is the ability of the system tester to offset a measured impedance value, for example battery impedance, obtained in a first test from the measured value of impedance in a subsequent test. The measured impedance value in the first test may be stored in the controller as a reference value pursuant a user input that may be entered in response to a prompt by the tester. The subsequent test may be made at circuit points that include the battery and associated circuitry. The controller will offset the measured impedance value by the offset value so that the device can display only the impedance of the associated circuitry. As another example, the latter test may be made at the same circuit points, under different load conditions or battery charging conditions, and the difference in measured impedance is directly displayed. The offset display capability may be a system feature that is an optional mode offered to the user. The tester may prompt for the user's preference as to whether the measured or difference value is to be displayed.

An additional benefit of the present disclosure is provided by an automated method for testing an electrical circuit of a vehicle using a system tester. Good lead connections to electrical circuit points under test can be verified. Impedance between the circuit points are calculated and displayed. The user may be prompted as to whether additional testing is to be performed. Testing continues in this manner until the user indicates that testing is completed. Subsequent tests may be made at the same circuit points or circuit points different from a prior test and may be made under different conditions, such as operation under various battery loading or charging conditions. The circuit points at which lead connections are made in the various tests may be chosen by the user or included as a suggestion in a prompt. For example, a first test would be made across battery terminals and successive tests made by changing one or both connections to other points in the circuit, for example a starter or alternator, to pinpoint possible abnormal impedance detected between two successive test sites. The system may store pre-established impedance threshold values for the various circuit sites and may permit the user to enter thresholds. The system may perform analysis and other calculations, such as determining available cranking current in, for example, a test of the starting circuit.

Additional advantages of the present disclosure will become readily apparent to those skilled in this art from the following detailed description, wherein only the preferred embodiment is shown and described, simply by way of illustration of the best mode contemplated. As will be realized, the disclosure is capable of other and different embodiments, and its several details are capable of modifications in various obvious respects, all without departing from the disclosure. Accordingly, the drawings and description are to be regarded as illustrative in nature, and not as restrictive.

BRIEF DESCRIPTION OF DRAWINGS

The present disclosure is illustrated by way of example, and not by way of limitation, in the figures of the accompanying drawing and in which like reference numerals refer to similar elements and in which.

DETAILED DESCRIPTION

Figure 1:
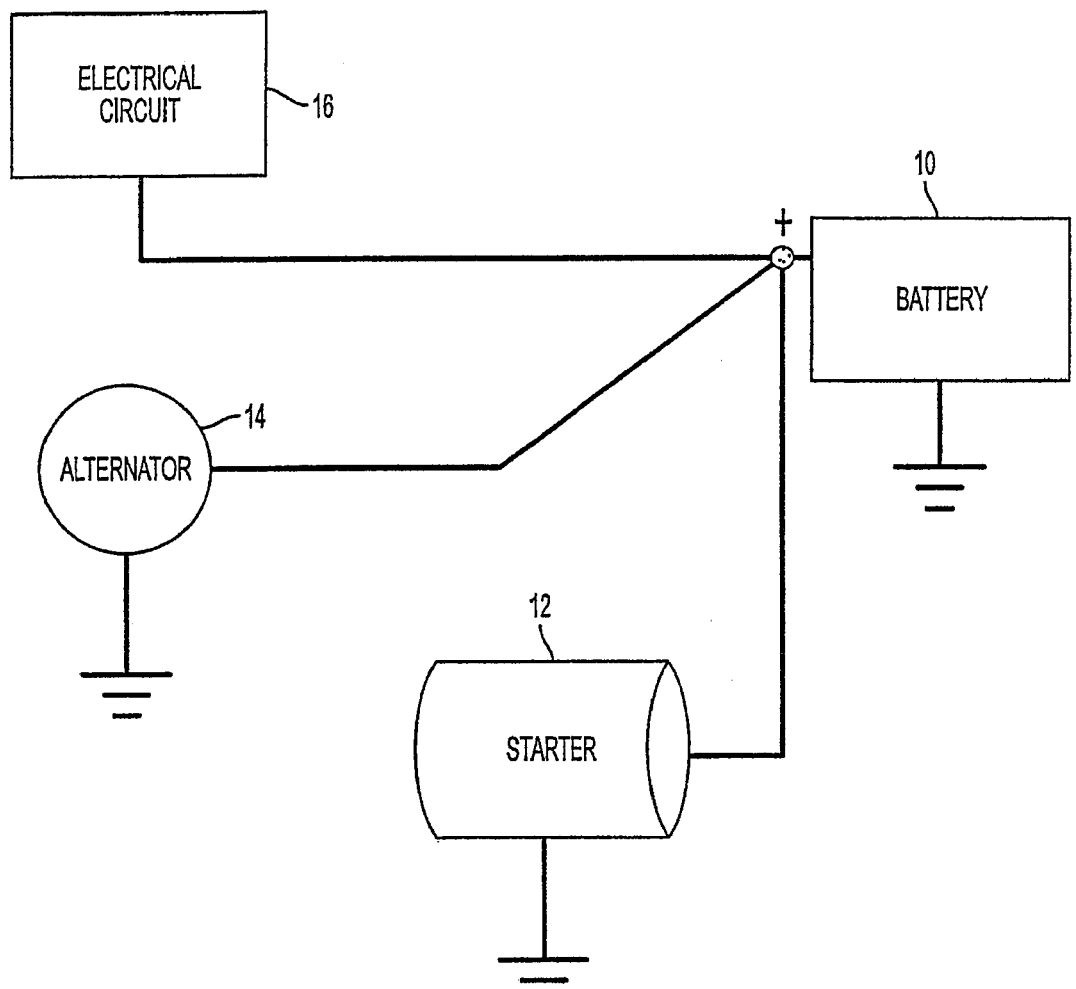
FIG. 1 is a block diagram broadly illustrative of a typical vehicle system circuit.

FIG. 1 is a generalized block diagram of a vehicle electrical system. Battery 10, starter 12 and alternator 14 are shown connected in parallel for simplicity of illustration. An auxiliary test terminal also may be provided to permit easier access for connection to the positive battery terminal. Electrical circuit 16 represents in general the remaining electrical elements and circuitry that draw current from the battery, including, for example, voltage regulator, radio, headlights, etc. Although shown as a block diagram also connected in parallel with the battery, it is understood that various series interconnections exist that are well known vehicle electrical circuit interconnections. Test leads of a tester, to be more fully described below, may be applied to the terminals of these devices individually or across any points in the electrical system.

Figure 2:
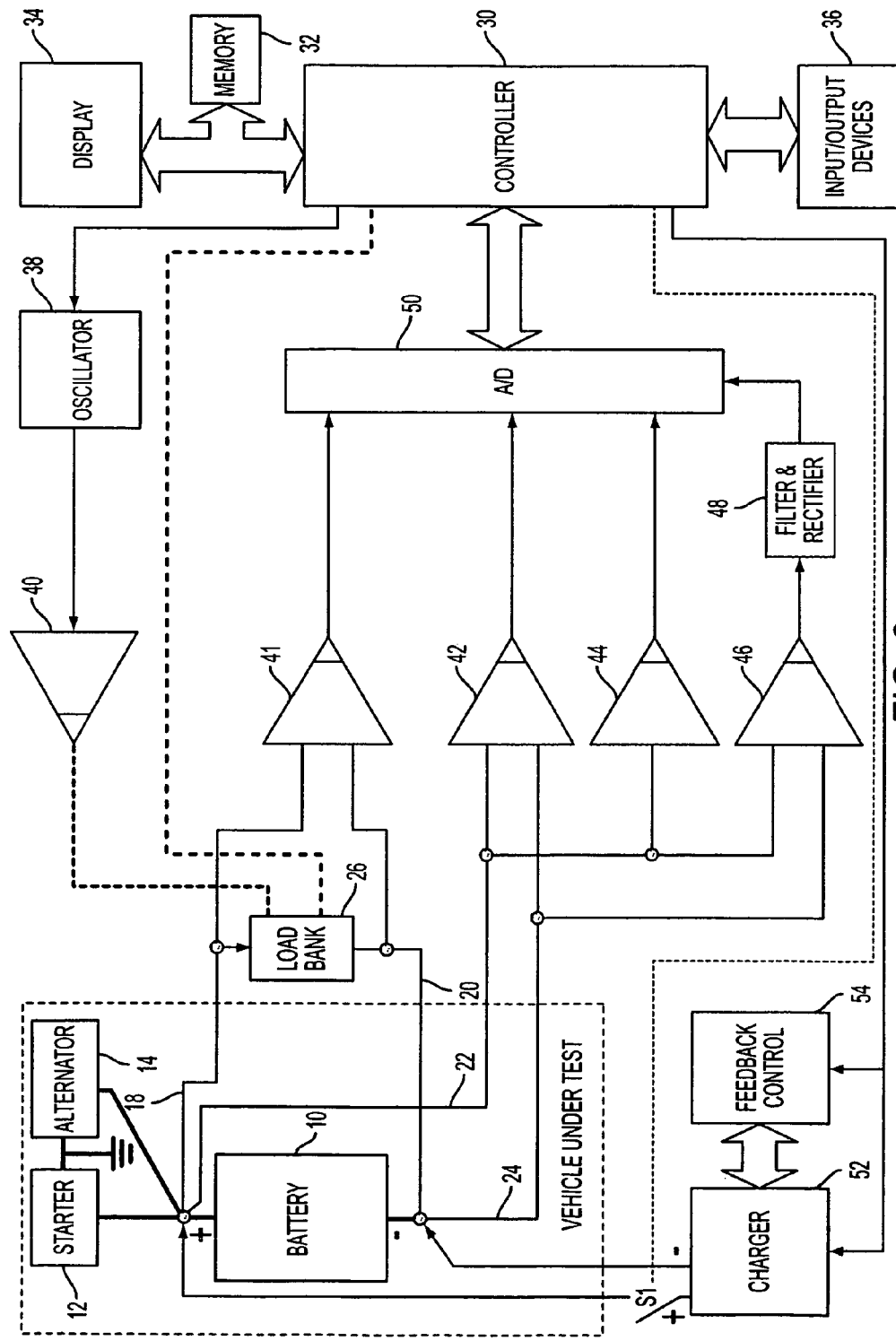
FIG. 2 is a diagram of tester system in accordance with the present disclosure.
Figure 3A:
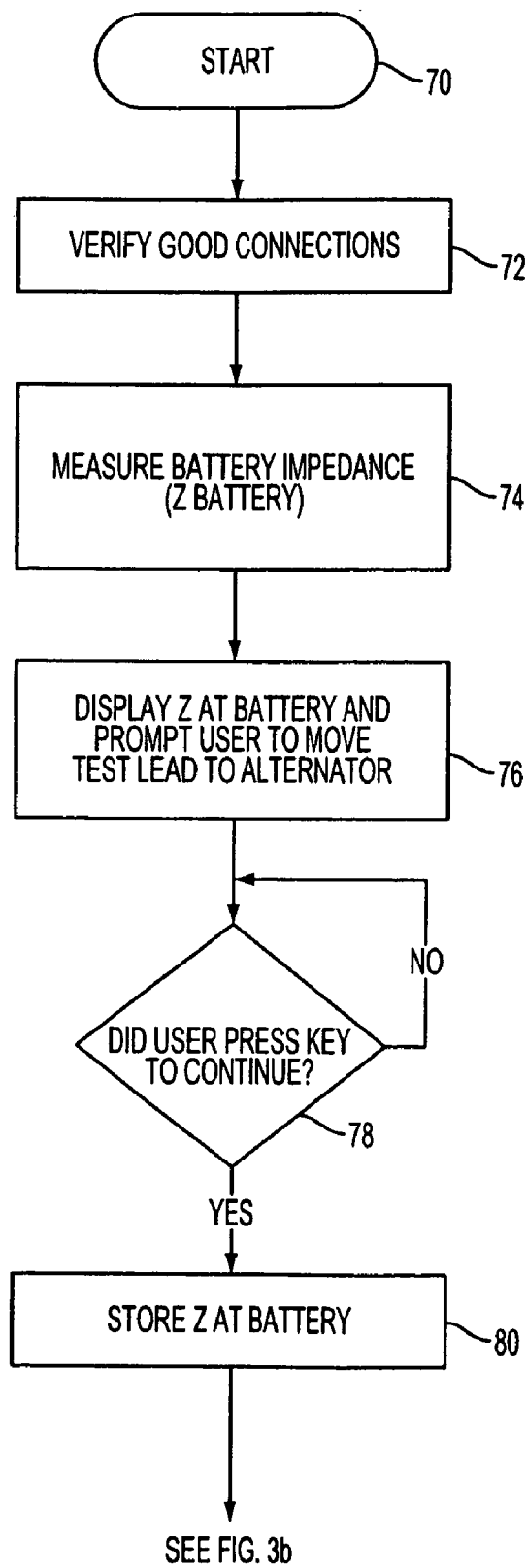
FIGS. 3a-3d comprise a flow chart exemplifying a testing routine in accordance with the present disclosure.
Figure 3B:
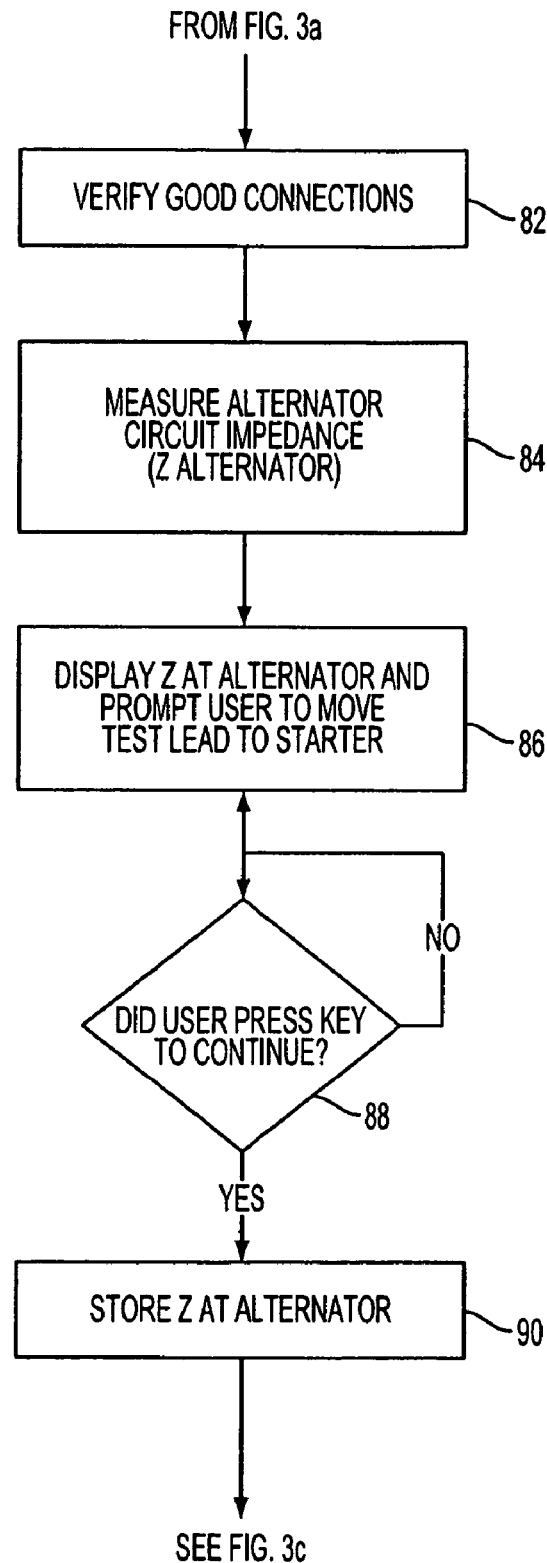
Figure 3C:
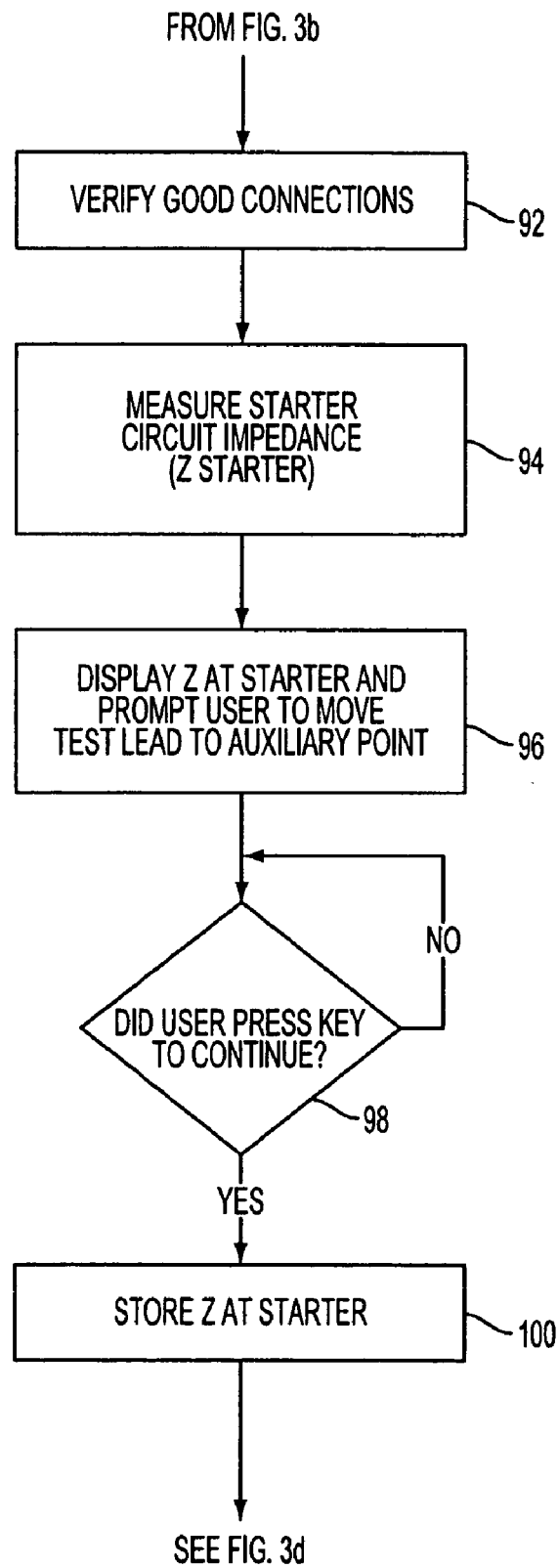
Figure 3D:
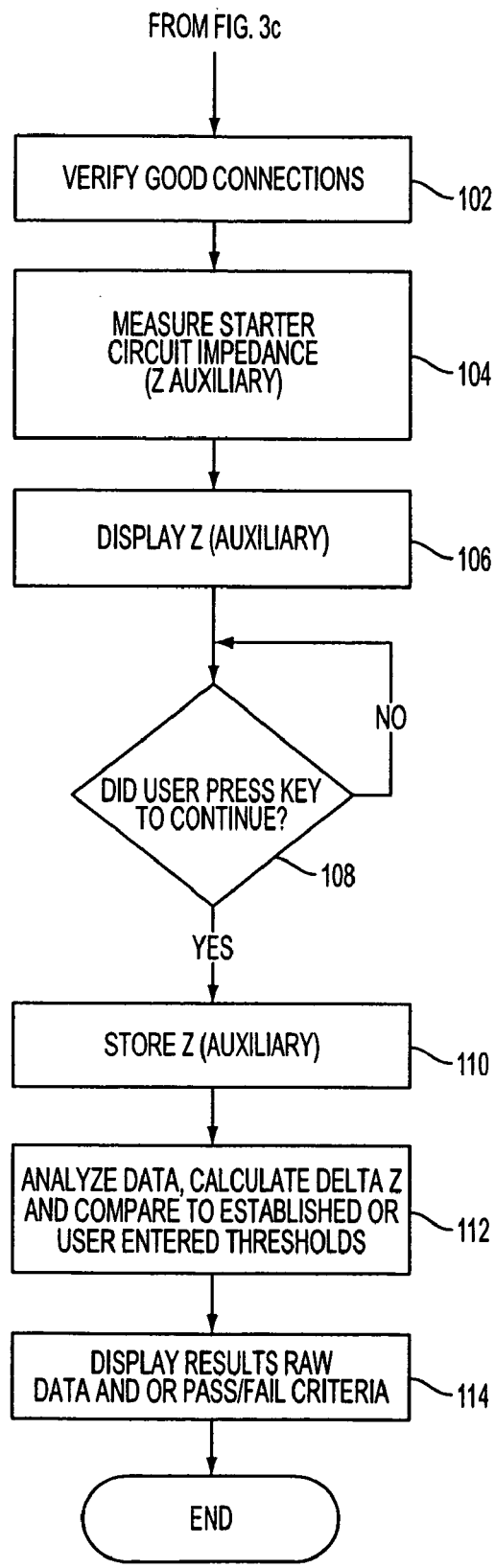

FIG. 2 exemplifies a system tester of the present disclosure connected across the battery terminals. The bold leads correspond to the vehicle connections shown in FIG. 1. While the tester is shown connected across the battery terminals, in operation testing may progress to various other circuit connection points. The tester incorporates a four point connection, known as a Kelvin connection, to the circuit points under test. A Kelvin style lead set allows two independent signals to be transferred to a device under test without affecting one another. A conventional Kelvin lead set has a 4 wire connection with two separate pairs of conductors. A load signal can be applied with one set of conductors while the other set measures a precise voltage measurement at the same point at which the load is applied to the device under test.

The four points of connection are made by a pair of load leads 18 and 20 and a pair of sense leads 22 and 24. Across the load leads is a load bank 26 that may comprise one or more resistors selectively inserted under the direction of controller 30. The controller may communicate with memory 32 and display 34 in conventional manner. The display may comprise an LCD device or equivalent. Input and output devices, shown generically at block 36, provide data input to the controller or transmission of data from the controller. For example, pre-established impedance thresholds for the specific vehicle components and testing routines may be supplied to the controller from an input device for storage in memory. Testing results and analyses may be transmitted from the controller to an external site.

The circuit connection points under test may be loaded by application of an AC current to load bank 26 via oscillator 38 and voltage-to-current converter 40. The oscillator is connected to controller 30. Current sense amplifier 41, connected across the load bank outputs a signal to an input of one channel of A/D converter 50. Connected to the sense leads 22 and 24 are DC volt amplifier 42, alternating current ripple amplifier 44 and AC voltage amplifier 46, the output of the latter applied to filter and rectifier 48. Each of these amplifiers provides an output to a respective channel input of A/D converter 50. The signals provided by these inputs are utilized by controller 30 to calculate impedance values using Ohm's law. Testing may also take place while battery charger 52, with associated feedback control 54 provides charging current to the battery. Reference is made to copending U.S. application Ser. No. 10/460,652 filed Jun. 13, 2003, for disclosure of a battery charging circuit and tester related to charger 52 and control 54.

As an example of operation of the system impedance measurement, an automated test may sequentially step the user through many test points of a vehicle starting and charging circuit. The tester measures the circuit impedance at these points and records them for analysis upon completion of the test. A flow chart for this particular automated test example is shown in FIGS. 3a-3d. The user would first connect the tester leads to the positive and negative terminals of the battery at the start of the test, step 70. The unit will test the connections at step 72 to verify that all four connections are good before proceeding. Good connections are indicated, for example, by similar readings on each load and sense lead pair.

At step 74, the tester measures and records the impedance of the battery. This measurement will be the basis for all other measurements taken during this test. The real time impedance measurements are available to the user via the tester display in step 76. At step 78, the tester prompts the user to continue, for example, by pressing a key. The prompt may also indicate that the user change the lead connections for the next test. In this example, the tester would display along with the measured impedance of the battery at step 76, a prompt to the user to move the leads from the positive battery terminal to the alternator output post. The system will be placed in a wait state for a user response for a period of time, after which the test is terminated in the absence of a response to the prompt.

If the user has input a response, as determined in step 78, the measured impedance of the battery is stored at step 80 and the user will have changed the lead connections to the alternator as prompted. At step 82, verification of good connections is again made. The alternator circuit impedance is measured and recorded at step 84 and displayed at step 86. Also displayed is a prompt to the user to move the test lead connections from the alternator to the positive terminal of the starter or an auxiliary point in the electrical circuit. In response to a positive response to the user prompt in step 88, the measured impedance of the alternator circuit is stored at step 90 and the user will have changed the lead connections to the starter as prompted.

At step 92, verification of good connections is again made. The starter circuit impedance is measured and recorded at step 94 and displayed at step 96. Also displayed is a prompt to the user to move the test lead connections from the starter to an alternative test terminal, such as a remote battery or other circuit point. In response to a positive response to the user prompt in step 98, the measured impedance of the starter is stored at step 100 and the user will have changed the lead connections as prompted. At step 102, verification of good connections is again made. The circuit impedance is measured and recorded at step 104 and displayed at step 106. The display in step 106 may include a prompt to the user to change connections for a further test and the process would continue as described above until no further prompts are issued. In the illustrated example, no further test is prompted; the user is prompted to continue to complete the testing procedure. In response to positive indication at step 108, the impedance of the circuit is stored at step 110. At step 112, the tester analyzes the test data. The difference for each impedance test is calculated. At step 114 the raw data as well analysis results may be displayed.

The test data can be displayed or analyzed in a number of ways. One possibility is to display or print the actual impedance measurements at each specific test point. The user can then interpret the data. Alternatively, the tester can calculate the differences in impedance between the different test points and compare them to cut points stored in memory or to cut points input by the user. Data may be analyzed by comparing raw impedance measurements to store values, which can be related to the vehicle type, make, model or VIN number, etc., of the vehicle under test. Displayed analysis results may include pass/fail criteria for the system as a whole or individual components and other calculations, such as available cranking current.

Figure 4:
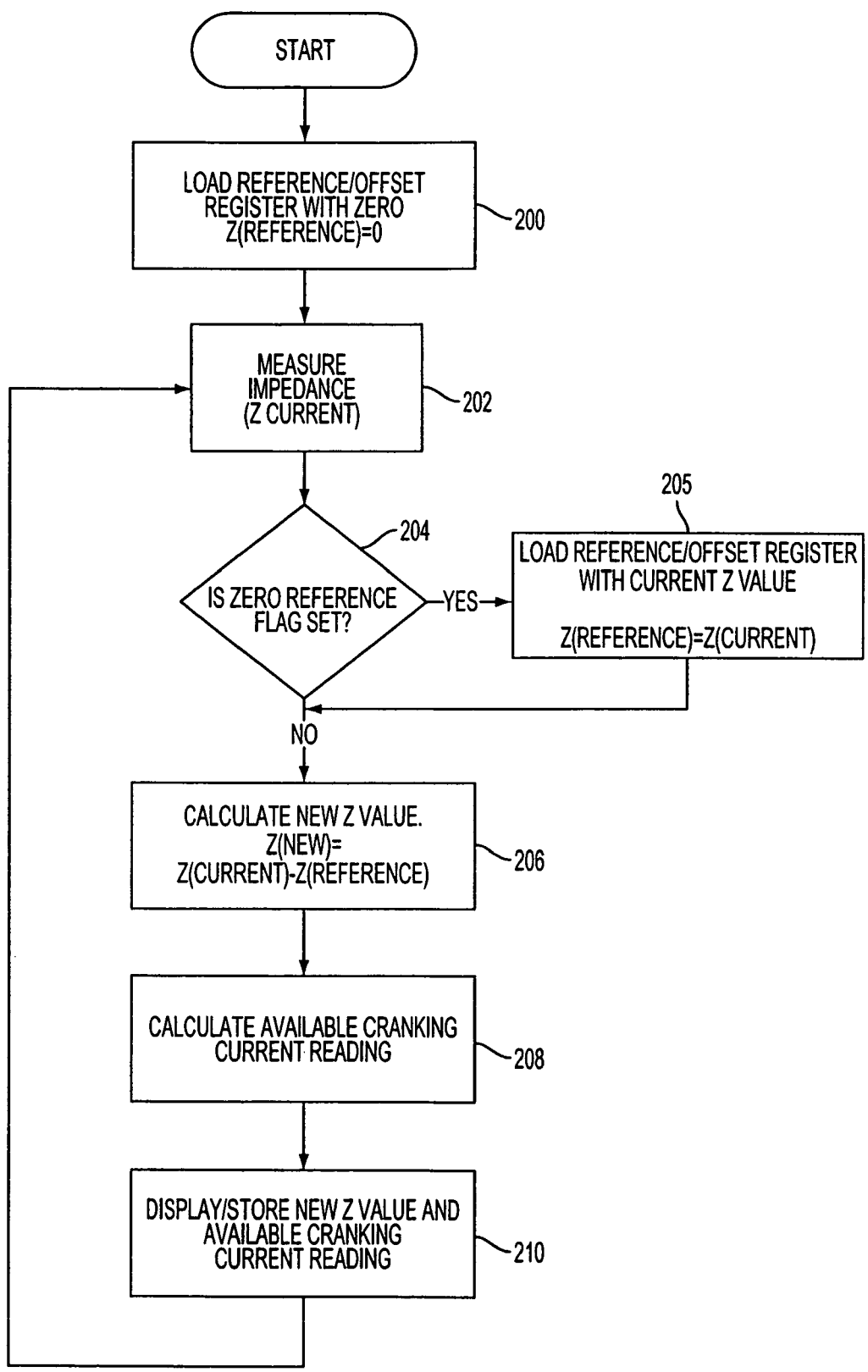
FIG. 4 is a flow chart illustrative of another aspect of the present disclosure.

FIG. 4 is a flow chart of a process for the testing system previously described by which the real time impedance display represents the difference between the calculated value of impedance at the current test points and a reference value. For this purpose, use may be made of an offset register. At step 200, the offset register is loaded with a zero value, indicating zero impedance. At step 202, measurement is made of the impedance at test points, for example, the battery terminals. At step 204, determination is made as to whether a zero reference flag has been set by the user. If a positive outcome is determined in step 204, the currently measured impedance value is loaded into the offset register as an impedance value reference. Otherwise, the register remains with zero value. At step 206, calculation is made of the difference between the currently measured impedance value and reference value stored in the register. This calculation yields a new impedance value reading. At step 208, the available cranking current is calculated from the current test. At step 210, the new impedance value reading and the available cranking current value are displayed. The process returns to step 202 for subsequent testing.

The user has the capability to set the "zero reference flag" so that any test impedance reading can be set as the reference. The user thus can have the immediate access to display of the difference between circuit impedance taken at any points in the circuit in subsequent tests and the impedance, for example, of the battery. At the user's option, the reference impedance value may be changed at a different test point to display the difference value for a subsequent test at different test points. Alternatively, subsequent tests may be taken under different loading and/or charging conditions for the same test points. For example, successive tests may be taken at the battery terminals under different loading conditions. The user may immediately be able to recognize an abnormal difference reading.

Figure 5:
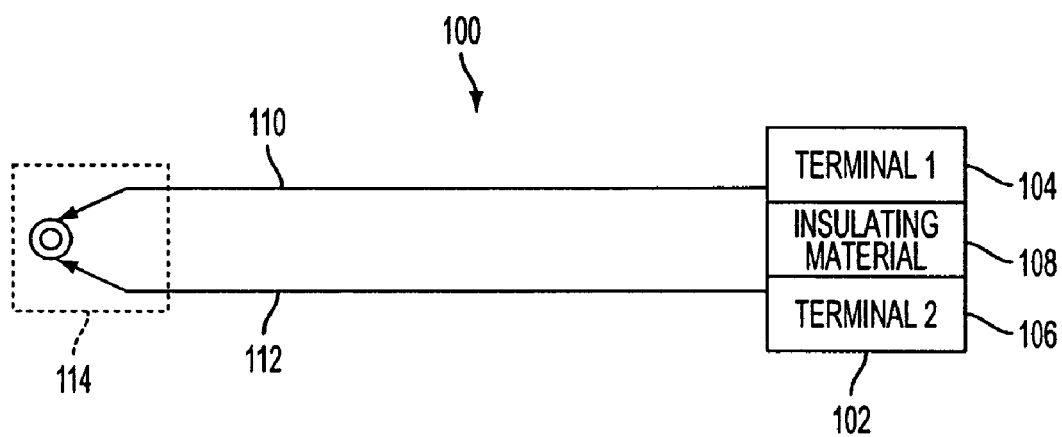
FIG. 5 is a diagram of a lead connecting device that may be used with tester system shown in FIG. 2.

FIG. 5 illustrates an adapter 100 that can be used to extend the length of most Kelvin style clamp/connections on test instruments that require Kelvin type connections, such as the test system of FIG. 2 so that a remote or normally inaccessible test point can be readily coupled to the test system. Terminal block 102 comprises terminals 104 and 106, which are separated by insulating material 108. A pair of conductors 110 and 112 are attached one end, respectively, to terminals 104 and 106 and attached at the other end to Kelvin clamp 114 that may connect to vehicle test terminal. The terminal block is configured for mating its terminals 104 and 106 to the Kelvin clamp of the system tester.

In the testing operation described above, for example, one of the test point connections may remain at the negative terminal of the battery while the Kelvin clamp connection is to be moved to the remote test point. If the Kelvin clamp of the system tester for load lead 18 and source lead 22, for example, cannot easily make connection with the new test point, it can be clamped to the terminal block 102. The Kelvin clamp 114, due to the extended length provided by conductors 110 and 112, provides the required access to the test point. A similar adapter can be provided if both circuit test points are remote.

In summary, a test system and method has been described that uses impedance measurement capabilities to diagnose problems with the wiring and or connections in an automotive style starting and charging system. The tester may evaluate the integrity of the cabling and connections between the different components used in the starting and charging circuit. These items may include a battery, alternator or generator, starter, voltage regulator, remote connection posts, solenoids and other components. The method of measuring impedance may be one of many different methods, for example, using application of a small AC load to the circuit in question and measuring the voltage response to this load.

In this disclosure there is shown and described only preferred embodiments and but a few examples of their versatility. It is to be understood that the disclosure is capable of use in various other combinations and environments and is capable of changes or modifications within the scope of the inventive concept as expressed herein. For example, the electrical tester technology may be embedded in the vehicle system rather than as a stand alone device. As another example, in the automated test mode, the user may be given the option after each test to complete the procedure and obtain a final read out analysis results. Another option may provide the user to establish in the system tester a preferred sequence of test sites for automated testing.

The embodiments described herein may include or be utilized with any appropriate voltage source, such as a battery, an alternator and the like, providing any appropriate voltage, such as about 12 volts, about 42 volts and the like. The embodiments may be used with any desired system or engine. Those systems or engines may comprise items utilizing fossil fuels, such as gasoline, natural gas, propane and the like, electricity, such as that generated by battery, magneto, solar cell and the like, wind and hybrids or combinations thereof. Those systems or engines may be incorporated into other systems, such as an automobile, a truck, a boat or ship, a motorcycle, a generator, an airplane and the like.

What is claimed is:

1. A method for testing a vehicle system circuit comprising the following steps performed by a tester:

storing an impedance reference value in the tester;

measuring the value of impedance between two separated points of the vehicle system circuit;

determining whether to modify the measured value of impedance for display; and in response to the step of determining, displaying the measured value of impedance if the outcome of the determining step is negative, and displaying an impedance value in which the measured value of impedance is offset by the stored impedance reference value if the outcome of the determining step is positive.

2. A method as recited in claim 1, wherein the determining step is responsive to the presence or absence of a user input to the tester.

3. A method as recited in claim 1, the storing step comprises loading a measured impedance value as the reference impedance value.

4. A method as recited in claim 3, further comprising the steps of:
taking a second measurement of the value of impedance in the vehicle system circuit; and
repeating the steps of determining and displaying; and
wherein the stored measured value is the first measured impedance value.

5. A method as recited in claim 4, wherein the second measurement is taken at different circuit points from the circuit points at which the first measurement is taken.

6. A method as recited in claim 4, wherein the second measurement is taken at the same circuit points at which the first measurement is taken and both measurements are taken under different operating conditions.

7. An automated method for using a tester to test an electrical circuit of a vehicle, wherein the tester includes at least two measurement leads, the method comprising the following steps performed by the tester:
a) verifying that good lead connections have been made at two separated points of the electrical circuit;
b) measuring impedance between the circuit points;
c) displaying the measured impedance;
d) providing a prompt including information to move at least one measurement lead to a different preset location of the electrical circuit for performing additional testing, wherein the tester stores data related to different preset locations of the electrical circuit for which additional testing should be performed;
e) storing the measured impedance obtained in the measuring step;
f) repeating steps a) through e) until it is determined that no additional testing is to be performed;
g) comparing all measured values stored in the previous steps with respective threshold values for different locations of measurements; and
h) display results obtained in the comparing step.

8. A method as recited in claim 7, wherein the step of determining comprises prompting a user for preference as to further testing and responding to a user input.

9. A method as recited in claim 7, wherein an initial test is performed with leads connected to the terminals of a battery.

10. A method as recited in claim 9, wherein the battery is tested under load.

11. A method as recited in claim 9 wherein a battery charger is connected across the battery terminals and the initial test is performed during a battery charging operation.

12. A method as recited in claim 9, wherein any of the additional test measurements are made with a lead connected to any element of the electrical circuit.

13. A method as recited in claim 7, wherein additional tests are performed with a lead connected, respectively, to an alternator and a starter.

14. A method as recited in claim 7, wherein the threshold values are pre-established for electrical system.

15. A method as recited in claim 7, wherein the threshold values are user entered values.

16. A method as recited in claim 7, wherein impedance values are displayed continuously.

* * * * *